(12) United States Patent
Yamada

(10) Patent No.: US 7,859,216 B2
(45) Date of Patent: Dec. 28, 2010

(54) STEPPER MOTOR APPARATUS AND METHOD FOR CONTROLLING STEPPER MOTOR

(75) Inventor: Yoshihisa Yamada, Shizuoka (JP)

(73) Assignee: Yazaki Corporation, Tokyo (JP)

(*) Notice: Subject to any disclaimer, the term of this patent is extended or adjusted under 35 U.S.C. 154(b) by 648 days.

(21) Appl. No.: 11/808,461

(22) Filed: Jun. 11, 2007

(65) Prior Publication Data
US 2008/0007195 A1   Jan. 10, 2008

(30) Foreign Application Priority Data
Jun. 23, 2006   (JP) ............................ 2006-173874

(51) Int. Cl.
*H02P 8/00* (2006.01)
(52) U.S. Cl. .................. 318/696; 318/685; 318/590
(58) Field of Classification Search ............ 318/696, 318/685, 590, 600, 563; 388/811
See application file for complete search history.

(56) References Cited
U.S. PATENT DOCUMENTS
2009/0045767 A1* 2/2009 Bergeron et al. ............ 318/590

FOREIGN PATENT DOCUMENTS
JP   2003-125599   4/2003

* cited by examiner

*Primary Examiner*—Karen Masih
(74) *Attorney, Agent, or Firm*—Kratz, Quintos and Hanson, LLP

(57) ABSTRACT

The object of the invention is to provide a stepper motor apparatus and a method for controlling a stepper motor, and particularly relates to a stepper motor apparatus for driving a pointer and a method for controlling the stepper motor. When an ignition switch is turned on, CPU 12 starts to feed a driving signal into the stepper motor in order to cause the stepper motor to rotate in a backward direction. Upon detecting that a protrusion 9 is in abutment with a stopper 10 on the basis of induced voltage generated on excitation coils 5 and 6, CPU stop rotation of the stepper motor 3 by maintaining the driving signal's phase at which the abutment is detected. Subsequently, CPU 12 feeds the driving signal into the stepper motor 3 in order to drive the stepper motor 3 to rotate in a direction where the protrusion 9 is driven against the stopper 10, and then stops rotation of the stepper motor 3 in a forward direction by maintaining a predetermined phase at which the driving signal arrives. Thereafter, CPU 12 drives the stepper motor to rotate such that a pointer 1 homes in on its commanded position θi.

5 Claims, 9 Drawing Sheets

STEPPER MOTOR APPARATUS AND METHOD FOR CONTROLLING STEPPER MOTOR

CROSS-REFERENCE TO RELATED APPLICATIONS

The present Application claims priority to Japanese Patent Application No. 2006-173874 filed Jun. 23, 2006, the entire disclosure of which, including the specification and drawings, is expressly incorporated herein by reference.

BACKGROUND OF THE INVENTION (1) Field of the Invention

The present invention relates to a stepper motor apparatus and a method for controlling a stepper motor, and particularly relates to a stepper motor apparatus for driving a pointer and a method for controlling the stepper motor.

(2) Description of the Related Art

Conventionally, a stepper motor apparatus has been found to be suitable for use in, for example, an automotive dashboard indicator. The indicator includes an dial having graphical indicia and a pointer which is driven around the dial. The stepper motor apparatus has been used as a device for driving the pointer.

This type of stepper motor apparatus provides a driving signal a duty cycle of which is modulated, and therefore alters the excitation state of an excitation coil inside the stepper motor periodically. As a result, a drive torque will be produced inside a magnetic rotor surrounded by the excitation coil, resulting in rotation of the stepper motor.

More specifically, during the stepper motor apparatus, the driving signal of the phase corresponding to the difference ($\theta-\theta'$) between an commanded position ($\theta$) and an actual position ($\theta'$) of the pointer is fed into the stepper motor, in order to rotate stepper motor ($\theta-\theta'$) degrees. Both the commanded position ($\theta$) and the actual position ($\theta'$) of the pointer have been stored in memory inside the stepper motor apparatus. In the case where the stepper motor apparatus initializes the actual position of the pointer on the basis of the driving signal which is fed into the stepper motor, it also initializes the commanded position of the pointer on the basis of the values each of which is measured and displayed by a variety of sensors. Thereby, the pointer can be driven around the dial having graphical indicia.

Meanwhile, during the indicator, due to the input of the value measured by means of a variety of sensors which vibration or noise of vehicles can adversely affect, the actual movement of the pointer may be different from its measured movement, i.e., ($\theta-\theta'$). If this phenomenon is repeated, the actual position $\theta$ stored in memory can be different from the position displayed on the dial, resulting in an inaccurate indication.

To solve the above-discussed problem, a stepper motor is provided with both a protrusion and a stopper. The protrusion is, for example, a projection portion which is formed on a gear of the pointer for transmitting rotation of the stepper motor to the pointer, and therefore is associated with the stepper motor. For this reason, the term protrusion described herein is equivalent to a driven member and these terms are interchangeably used herein. When the stopper is in abutment with the protrusion, the stepper motor's rotation is obstructed by the stopper. In the case where the stopper is in abutment with the protrusion, the pointer is positioned at a zero point (it is also designated as a reference point).

Further, during the stepper motor apparatus, whenever an ignition switch is switched on so as to supply power thereto, the driving signal is fed into the stepper motor such that the stepper motor is made to rotate in the backward direction where the protrusion is driven toward the stopper. As a result, the protrusion is forced to abut the stopper, and thereby the pointer is compulsively stopped at the zero point. Finally, the stepper motor apparatus can reset the actual position ($\theta'$) stored in the memory to the zero point.

In the case where the actual position ($\theta'$) stored in the memory is reset to the zero point, since the pointer on the dial also indicates the zero point, it is possible to reset the difference ($\theta-\theta'$) between the actual position stored in the memory and the position of the pointer displayed on the dial.

Moreover, the above discussed abutment detection may be carried out, for example, by examining the voltage of on both ends of detection coils where induced voltage generates in response to rotation of the magnetic rotor. For example, the voltage levels of both ends of the detection coils are higher than a threshold voltage level, which indicates that the magnetic rotor rotates while generating a high level of induced voltage, and the protrusion is not in abutment with the stopper.

On the other hand, when the voltage level is lower than a threshold voltage level, the induced voltage is hardly generated, and the magnetic rotor is found to be obstructed mechanically by the stopper being in abutment with the protrusion. Additionally, the use of an excitation coil, which has been controlled in a non-energized manner, as a driving coil during rotation of the stepper motor is disclosed in Japanese Publication No. 2003-125599.

The position where the protrusion is in abutment with the stopper depends on a thermal expansion or an aged deterioration of each component comprising the stepper motor apparatus under the ambient temperature. Therefore, when the output of the driving signal corresponding to the amount of difference ($\theta-\theta'$) is intended from the phase of the driving signal at the point of detecting that the protrusion is in abutment with the stopper, a problem occurs that the indication of the pointer may be varied depending on the aged deterioration or the thermal expansion of each components comprising the stepper motor apparatus due to a change in ambient temperature.

Thus, a need exists for an improved stepper motor apparatus for preventing the indication of the pointer from varying even if a change in the position where the protrusion is in abutment with the stopper occurs, and a method for controlling the stepper motor.

SUMMARY OF THE INVENTION

According to one aspect of the invention, there is provided a stepper motor apparatus including a stepper motor rotating in response to a driving signal, a duty cycle of which is modulated, supplied thereto in order to drive a pointer, a stopper configured to stop rotation of the stepper motor mechanically in cases where a driven member associated with the stepper motor is in abutment therewith, an initialization driving device configured to feed the driving signal into the stepper motor in order to drive the stepper motor to rotate in a backward direction where the driven member is driven toward the stopper, a detection coil producing an induced voltage by means of rotation of the stepper motor, a position detection device configured to determine whether the driven member is in abutment with the stopper or not by examining the induced voltage on the detection coil, a first stopping device configured to stop rotation of the stepper motor in the backward direction by maintaining the driving signal's phase at which the abutment is detected by the position detection device, and a normal driving device configured to feed the driving signal into the stepper motor in order to drive the stepper motor to rotate in a direction where the pointer homes in on its commanded position, after first stop by the first stopping device, characterized in further including, a memory configured to store a predetermined phase, a forward driving device configured to feed the driving signal into the stepper motor in order to drive the stepper motor to rotate in a forward direction where the driven member is driven against the stopper, after first stop by the first stopping device, and a second stopping device configured to stop rotation of the stepper motor in the forward direction by maintaining a predetermined phase when the driving signal transmitted by the forward driving device arrives at the predetermined phase, wherein the normal driving device drives the stepper motor to rotate again after second stop by the second stopping device.

In accordance with the first embodiment of the stepper motor apparatus, because the forward driving device is configured to feed the driving signal into the stepper motor in order to drive the stepper motor to rotate in the forward direction where the driven member is driven against the stopper, after first stop by the first stopping device, the second stopping device is configured to stop rotation of the stepper motor in the forward direction by maintaining the predetermined phase when the driving signal transmitted by the forward driving device arrives at the predetermined phase, and the normal driving device drives the stepper motor to rotate again after second stop by the second stopping device, it is possible to begin to rotate the stepper motor at the predetermined phase (i.e., at the same position) by means of the normal driving device, even if a change in the position where the protrusion is in abutment with the stopper occurs depending on the aged deterioration or the thermal expansion of each components comprising the stepper motor apparatus due to, for example, a change in ambient temperature.

In one preferred embodiment of the invention, there is provided an enhancement of the first embodiment further including a drive initiating device configured to initiate operations of both the initialization driving device and the position detection device, pursuant to a storage instruction, and a storing device configured to store a phase, which is a predetermined phase difference out of phase with the driving signal's phase at which the abutment is detected by the position detection device, as the predetermined phase in the memory.

In accordance with the above-discussed second embodiment of the stepper motor apparatus, because the drive initiating device can initiate operations of both the initialization driving device and the position detection device, pursuant to the storage instruction, and the storing device can store the phase, which is the predetermined phase difference out of phase with the driving signal's phase at which the abutment is detected by the position detection device, as the predetermined phase in the memory, even if the position where the driven member is in abutment with the stopper is altered in the forward direction with respect to the abutting position when the storage instruction has been output, the driving operation can be initiated by the normal driving device at the same position.

In another preferred embodiment of the invention, there is provided an enhancement of the second embodiment of the stepper motor apparatus characterized in that the predetermined phase difference is 270 degrees.

In accordance with the above-discussed third embodiment of the stepper motor apparatus, because the predetermined phase difference is set to 270 degrees, as long as the position where the driven member is in abutment with the stopper is altered from 0 to 180 degrees in the forward or backward direction with respect to the abutting position when the storage instruction has been output, the driving operation can be initiated by the normal driving device at the same position.

According to another aspect of the invention, there is provided a method for controlling a stepper motor, comprising the steps of (A) feeding a driving signal, a duty cycle of which is modulated, into the stepper motor in order to drive the stepper motor to rotate in a backward direction where a driven member associated with the stepper motor is driven toward a stopper, (B) determining whether the driven member is in abutment with the driven member or not by examining an induced voltage on a detection coil resulting from the step (A), (C) stopping rotation of the stepper motor in the backward direction by maintaining the driving signal's phase at which the abutment is detected in step (B), and (D) feeding the driving signal into the stepper motor in order to drive the stepper motor to rotate in a direction where a pointer, which is driven by the stepper motor, homes in on its commanded position after the step (C), in stepwise fashion, characterized by, between the step (C) and the step (D), further including the step of feeding the driving signal into the stepper motor in order to drive the stepper motor to rotate in a forward direction where the driven member is driven against the stopper, and subsequently, the step of stopping rotation of the stepper motor in the forward direction by maintaining a predetermined phase when the driving signal arrives at the predetermined phase stored in a memory.

In accordance with the afore-mentioned embodiment of the method for controlling the stepper motor, because between the step (C) and the step (D), the step of feeding the driving signal into the stepper motor in order to drive the stepper motor to rotate in the forward direction where the driven member is driven against the stopper, and subsequently, the step of stopping rotation of the stepper motor in the forward direction by maintaining the predetermined phase when the driving signal arrives at the predetermined phase stored in a memory are carried out in stepwise fashion, it is possible to begin to rotate the stepper motor at the predetermined phase (i.e., at the same position) by means of the normal driving device, even if a change in the position where the driven member is in abutment with the stopper occurs depending on the aged deterioration or the thermal expansion of each components comprising the stepper motor apparatus due to, for example, a change in ambient temperature.

According to yet another aspect of the invention, there is provided a method for controlling a stepper motor, comprising the steps of (A) feeding a driving signal, a duty cycle of which is modulated, into the stepper motor in order to drive the stepper motor to rotate in a backward direction where a driven member associated with the stepper motor is driven toward a stopper, (B) determining whether the driven member is in abutment with the driven member or not by examining an induced voltage on a detection coil resulting from the step (A), (C) stopping rotation of the stepper motor in the backward direction by maintaining the driving signal's phase at which the abutment is detected in step (B), and (D) feeding the driving signal into the stepper motor in order to drive the stepper motor to rotate in a direction where a pointer, which is driven by the stepper motor, homes in on its commanded position after the step (C), in stepwise fashion, characterized by, between the step (C) and the step (D), further including the step of feeding the driving signal into the stepper motor in order to drive the stepper motor to rotate an amount of phase difference between the phase as maintained in the step (C) and a predetermined phase stored in a memory, in a forward direction where the driven member is driven against the stopper, and subsequently, the step of stopping rotation of the stepper motor in the forward direction by maintaining the predetermined phase, after completion of the afore-mentioned driving signal supply.

In accordance with the afore-mentioned embodiment of the method for controlling the stepper motor, between the step (C) and the step (D), the step of feeding the driving signal into the stepper motor in order to drive the stepper motor to rotate an amount of phase difference between the phase as maintained in the step (C) and the predetermined phase stored in a memory, in the forward direction where the driven member is driven against the stopper, and subsequently, the step of stopping rotation of the stepper motor in the forward direction by maintaining the predetermined phase, after completion of the afore-mentioned driving signal supply, are carried out in stepwise fashion, it is possible to begin to rotate the stepper motor at the predetermined phase (i.e., at the same position) by means of the normal driving device, even if a change in the position where the protrusion is in abutment with the stopper occurs depending on the aged deterioration or the thermal expansion of each components comprising the stepper motor apparatus due to, for example, a change in ambient temperature.

Figure 1:
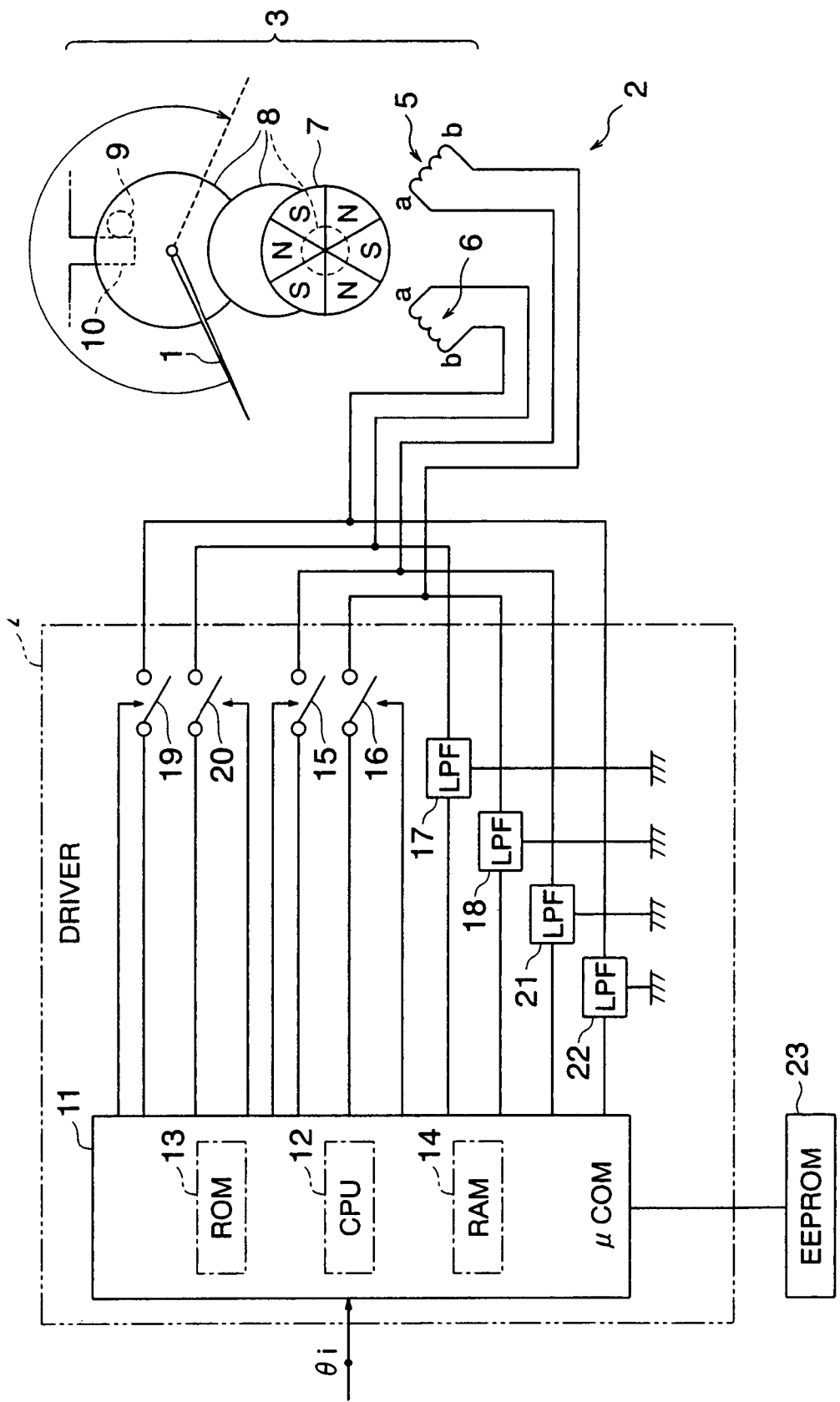
FIG. 1 is a drawing illustrating an indicator equipped with a stepper motor apparatus for implementing a method for driving a stepper motor in accordance with an embodiment of the present invention.

The foregoing summary, as well as the following detailed description of certain embodiments of the present invention, will be better understood when read in conjunction with the appended FIGS. 1 to 9. For the purpose of illustrating the invention, there is shown in the drawings, certain embodiments. It should be understood, however, that the present invention is by no means limited by the appended drawings.

DESCRIPTION OF THE PREFERRED EMBODIMENTS

Figure 2:
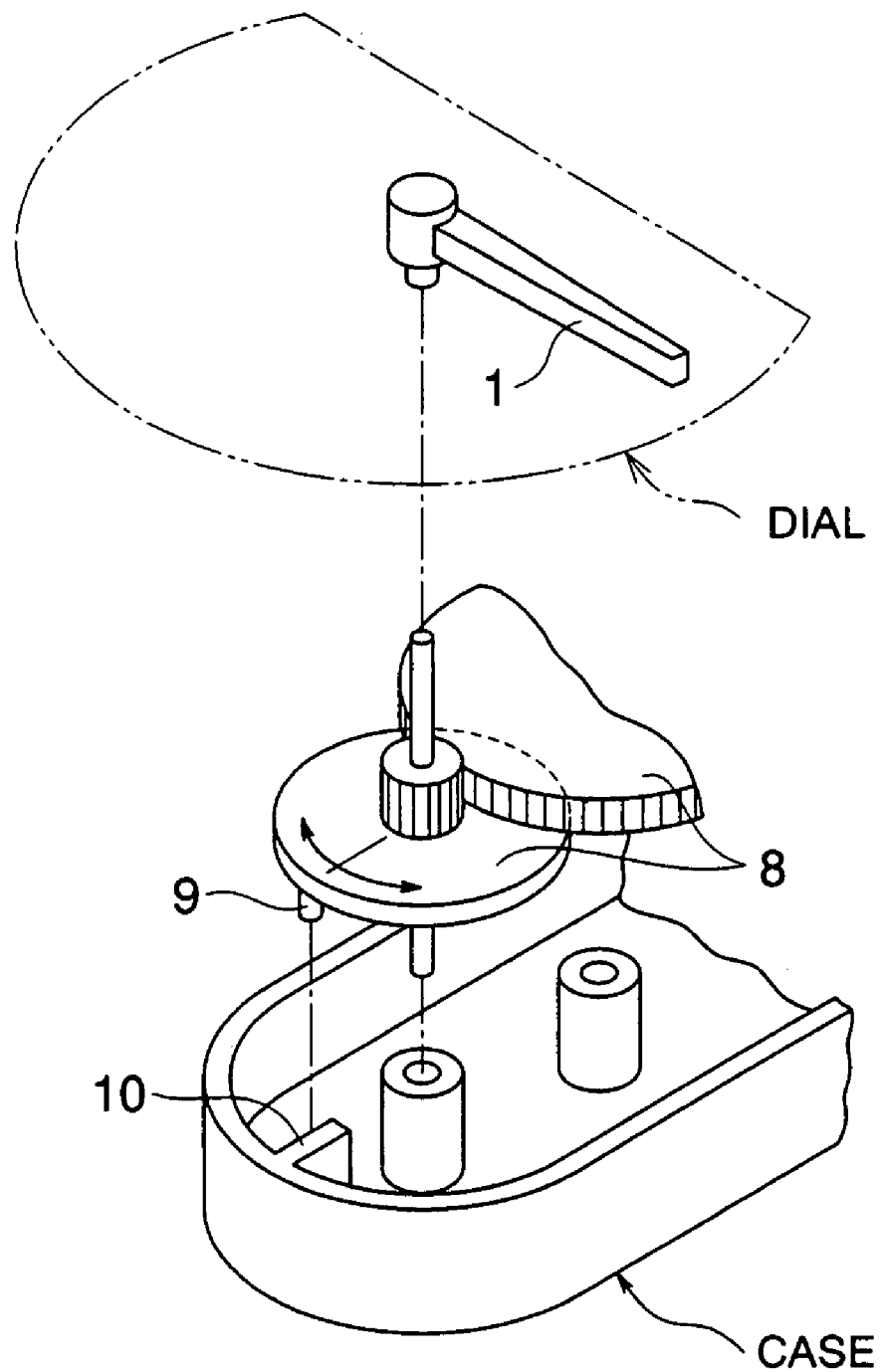
FIG. 2 is an exploded perspective view of the indicator of FIG. 1.

Referring to FIG. 1, there is provided a circuit diagram illustrating an indicator equipped with a stepper motor apparatus for implementing a method for driving the stepper motor in accordance with an embodiment of the present invention. FIG. 2 is an exploded perspective view of the indicator of FIG. 1. The indicator is comprised of a pointer 1, and a stepper motor apparatus 2 configured to drive the pointer 1. The pointer 1 is located on a dial with the scale of the value measured by a sensor device such as a speedometer. (Refer to FIG. 2)

The stepper motor apparatus 2 comprises a stepper motor 3, and a driver 4 for rotating the stepper motor 3. The stepper motor 3 comprises two excitation coils 5 and 6, a magnetic rotor 7 which rotates depending on a change in excitation state of the excitation coils 5 and 6, a gear assembly 8 configured to input a driving force to the pointer 1, and a case.

The magnetic rotor 7 is disc-like, and has three pairs of poles (e.g. three pairs of north and south poles) that are alternately attracted by a magnetic field. The gear assembly 8 is comprised of three gears, which are engaged with one another. One gear of the gear assembly 8 is fixed to the rotational axis of the magnetic rotor 7, and another gear is fixed to the rotational axis of the pointer 1. The remaining gear of the gear assembly 8 is sandwiched between the gear fixed to the magnetic rotor 7 and the gear fixed to the pointer 1.

The stepper motor apparatus 2 is comprised of a protrusion 9, which is a driven member interlocked with (i.e., associated with) the stepper motor 3, and a stopper 10, which is placed in abutment with the protrusion 9 and is configured to stop rotation of the stepper motor 3 mechanically. The protrusion 9 is formed as a projection on one side of the gear, the opposite side of which is fixed to the rotational axis of the pointer 1. The stopper 10 is formed as a projection on the case.

When the stepper motor 3 rotates in a direction where the protrusion 9 is driven toward the stopper 10, the direction is hereinafter designated as a "backward direction." As compared to the above discussed backward direction, when the stepper motor 3 rotates in a direction where the protrusion 9 is driven against the stopper 10, the direction is hereinafter designated as a "forward direction."

Figure 3:
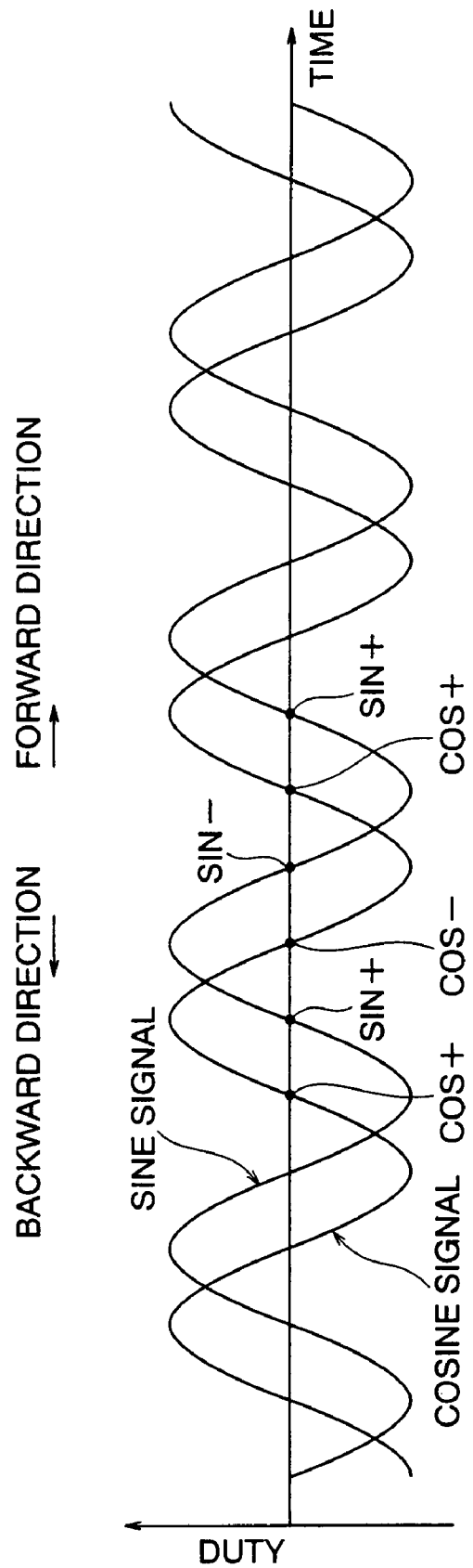
FIG. 3 is a time chart of sine and cosine signals supplied to excitation coils.

Provided herewith is a construct of the driver 4. The driver 4 is equipped with a microcomputer 11 connected to the excitation coils 5 and 6. The microcomputer is hereinafter designated as "µCOM 11." µCOM 11 is comprised of a central processing unit (CPU) 12 for performing a variety of operations commanded by programs, ROM 13 as a read-only memory for storing the programs to be processed by the CPU 12, a work area utilized in the course of processes carried out by CPU, and RAM 14 as a read/write memory for storing a variety of data.

µCOM 11 is configured to provide the excitation coils 5 and 6 with driving signals, i.e., sine and cosine signals where the duty cycle of the pulse is modulated as depicted in FIG. 3, in order to cause the stepper motor 3 to rotate. Sine signal and cosine signal are 90 degree out of phase with each other. Moreover, referring to FIG. 3, although respective duty cycles of the pulses (i.e., sine and cosine signals) seem to be successively modulated, they are in fact discretely modulated.

The excitation coil 5 is connected to µCOM 11 on its both ends via switches 15 and 16. These switches 15 and 16 will be switched on or off by µCOM 11 in a controllable manner. In addition, the excitation coil 6 is connected to µCOM 11 on its both ends via low-pass filters (LPF) 21 and 22, thereby allowing induced voltage generated from the excitation coil 6 to be fed into μCOM 11 during an event where the switches 19 and 20 are switched off.

Further, the above discussed μCOM 11 is connected to EEPROM 23, a rewritable memory device, in which the phases COS+, COS− and SIN+ (refer to FIG. 3) where excitation coils 5 and 6 are controlled in a non-energized manner are in advance stored in the memory as the phases configured to carry out a position detection process.

In the case where sine and cosine signals causing the stepper motor 3 to rotate in the backward direction are fed into the excitation coils 5 and 6, during the stepper motor apparatus 2, the protrusion 9 is made to be in abutment with the stopper 10 during an event where the phases of sine and cosine signals being, for example, SIN+. During EEPROM 23, the phase COS+, which is 270 degree out of phase with the phase SIN+, is stored as a predetermined phase in the memory in advance. μCOM 11 is also connected to both an ignition switch (not shown) and a switch for storage instruction (not shown). During μCOM 11, the measurements of a sensor are input as a commanded position θi.

Figure 4:
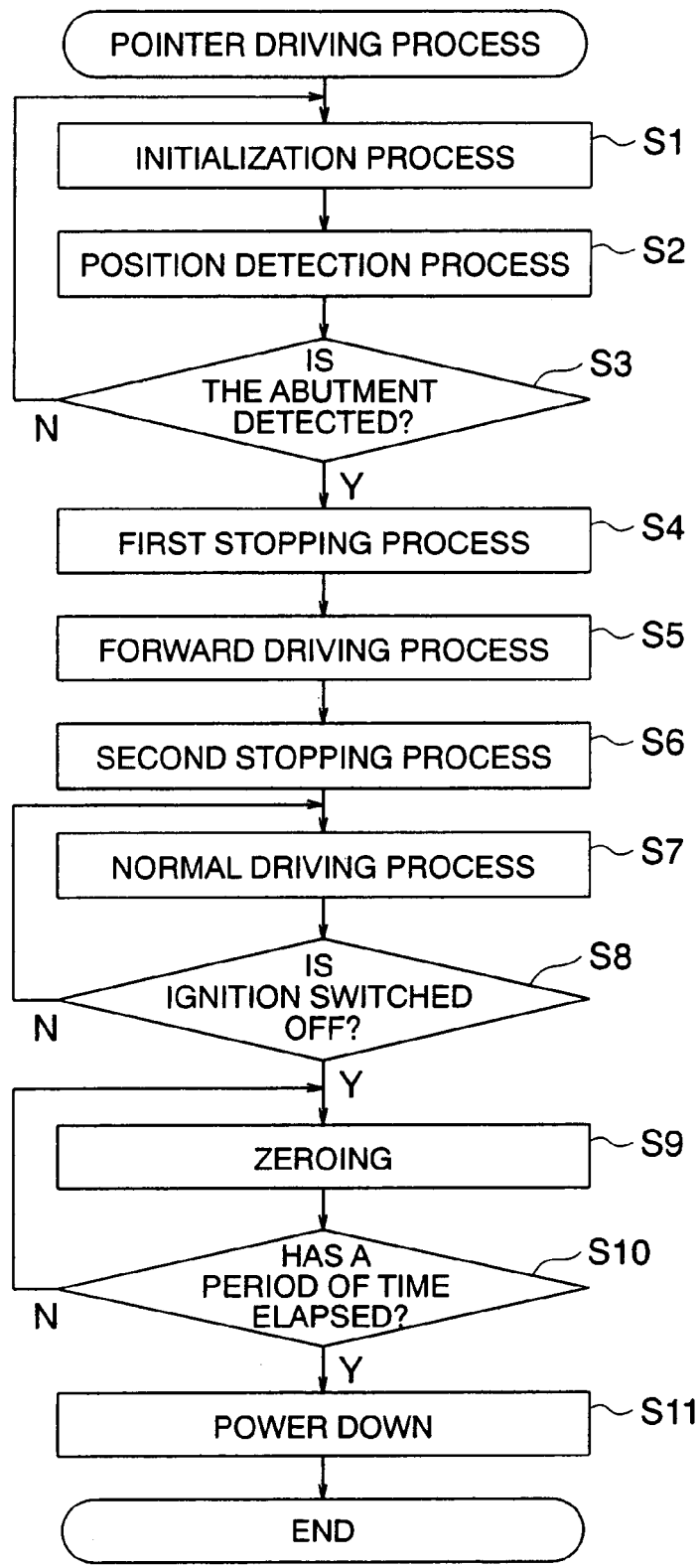
FIG. 4 is a process flow chart illustrating a process for driving a pointer in CPU comprising the indicator of FIG. 1.
Figure 5:
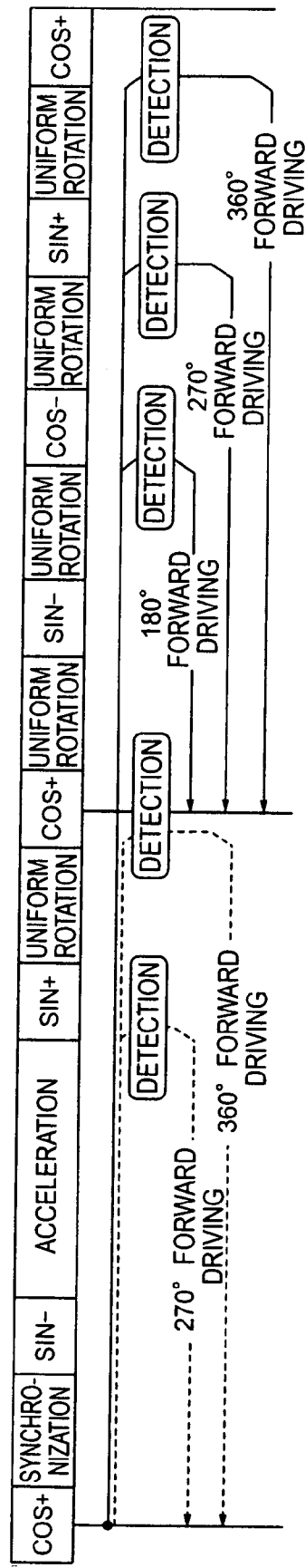
FIG. 5 is a timing chart illustrating timing for position detection, and phase variation in sine and cosine signals in the process of FIG. 4.

FIGS. 4 and 5 illustrate an operation of the indicator in accordance with an embodiment of the present invention. More specifically, FIG. 4 is a process flow chart illustrating a process for driving the pointer in CPU 12, one component of the indicator of FIG. 1. FIG. 5 is a timing chart illustrating timing for position detection, and phase variation in sine and cosine signals in the initialization process as depicted in FIG. 4. At first, CPU 12 initiates the process for driving a pointer, as depicted in FIG. 4, when the vehicle ignition is turned on.

In the course of above discussed process, CPU functions as an initialization driving device, and is configured to operate the initialization process, and thereby to supply sine and cosine signals to the excitation coils 5 and 6 such that the stepper motor 3 is made to rotate in the backward direction (Step S1). In this case, as shown in FIG. 5, CPU 12 begins to supply sine and cosine signals at the phase COS+ which has been stored as a predetermined phase in EEPROM 23.

During the initialization process, as shown in FIG. 5, CPU 12 synchronizes the stepper motor 3 with a low frequency whose frequency is below a self-start frequency ranging from the phase COS+ to the phase SIN−. The term "self-start frequency" is defined herein as a maximum rotational frequency in which the stepper motor 3 in a stopped state begins to rotate in response to a change in an excitation state. Thereafter, CPU 12 operates an acceleration process for accelerating rotation of the stepper motor 3 from the phase SIN− to the phase SIN+.

In the case where the phases of sine and cosine signals become SIN+, CPU 12 functions as a position detecting device so as to carry out a position detection process. (Step S2) In the position detection process, CPU 12 switches off switches 15, 16, 19 and 20 which are connected to the both ends of the excitation coils 5 and 6 to which sine signal is supplied. Under these circumstances, since the excitation coils 5 and 6 which have been controlled in a non-energized manner are made to be opened, assuming that the stepper motor 3 is rotating, the excitation coils 5 and 6 will produce induced voltage.

CPU 12 decides whether the induced voltage is produced or not by examining the voltage, which is supplied through switches 17, 18, 21 and 22, on the both ends of the excitation coils 5 and 6, and therefore concludes whether the protrusion 9 is in abutment with the stopper 10 or not. In the case where the protrusion 9 is found to be placed in abutment with the stopper 10 (i.e., "N" in the step S3) as a result obtained from the step of the position detection process (i.e., step S2), CPU 12 goes back to the step S1.

After reverting to the step S1, CPU rotates the stepper motor 3 at a constant velocity. Whenever sine and cosine signals become the phases COS+, COS− and SIN+, which have been stored in EEPROM 23 and are utilized with the position detection process, CPU 12 proceeds the position detection process (i.e., the step S2).

Contrary to above discussed case, if CPU 12 determines that the protrusion 9 is, placed in abutment with the stopper 12 through the position detection process of the step S2 (i.e., "Y" in the step S3), CPU functions as a first stopping device so that CPU will stop rotation of the stepper motor 3 in the backward direction by maintaining the phase COS+, COS− or SIN+ each of which corresponds to the phase of sine or cosine signal at the moment when the protrusion is detected to be in abutment with the stopper 10. It is also designated as a "first stopping process" or a "step S4."

After the stepper motor 3 has been stopped by the first stopping device (i.e., after the first stop), CPU 12 now functions as a forward driving device, and therefore supplies sine and cosine signal to the stepper motor 3 in order to drive the stepper motor 3 to rotate in the forward direction where the protrusion 9 is driven against the stopper 10. This step is hereinafter designated as a "forward driving process" or a "step S5." Thereafter, CPU 12 functions as a second stopping device so that at the moment when sine and cosine signals supplied by the forward driving process arrive at a predetermined phase COS+, CPU 12 stops rotation of the stepper motor 3 in the forward direction by maintaining the phase COS+. It is hereinafter designated as a "second stopping process" or a "step S6."

In other words, in the case of the forward driving process, CPU 12 provides the driving signal in order to rotate the stepper motor 3 in the forward direction in an angle of 360, 270 or 180 degrees which corresponds to the phase difference between the predetermined phase COS+ and the phase COS+, COS− or SIN+ as maintained by the first stopping process, and in the case of the second stopping process, upon completion of the above-mentioned supply of the driving signal, CPU 12 stops rotation of the stepper motor 3 in the forward direction by maintaining the predetermined phase COS+.

Thereafter, CPU 12 functions as a normal driving device, and supplies sine and cosine signals to the stepper motor 3 such that the stepper motor 3 is made to rotate in the direction where the pointer 1 is driven toward the commanded position θi. It is designated as a "normal driving process" or a "step S7." Subsequently, the above-mentioned normal driving process is repeated until the ignition is turned off. In the case where the ignition is switched off (i.e., "Y" in step S8), CPU 12 supplies sine and cosine signals to the excitation coils 5 and 6 again such that the stepper motor 3 is made to rotate in the backward direction where the protrusion 9 is driven toward the stopper 10. It is designated as a "zeroing" or a "step S9."

The zeroing of the stepper motor 3 is performed for a period of time or until the pointer 1 returns to a zero point on the dial. The term "a period of time" is meant by time the amount of time elapsed for pointer 1 to return from the maximum value to the zero position on the dial. After a period of time elapses (i.e., "Y" in step S10), CPU 12 turns off power (step S11), and then completes this pointer driving process.

By means of carrying out above steps, as shown in FIG. 5, in the case of initialization of the step S1, there is provided sine and cosine signals from the phase COS+. Further, in the case of the first cycle, the position detection process will be carried out in the phases SIN+ or COS+, and in the case of any cycle after the second cycle, the position detection process will be carried out in the phases COS−, SIN+ or COS+.

Figure 6A:
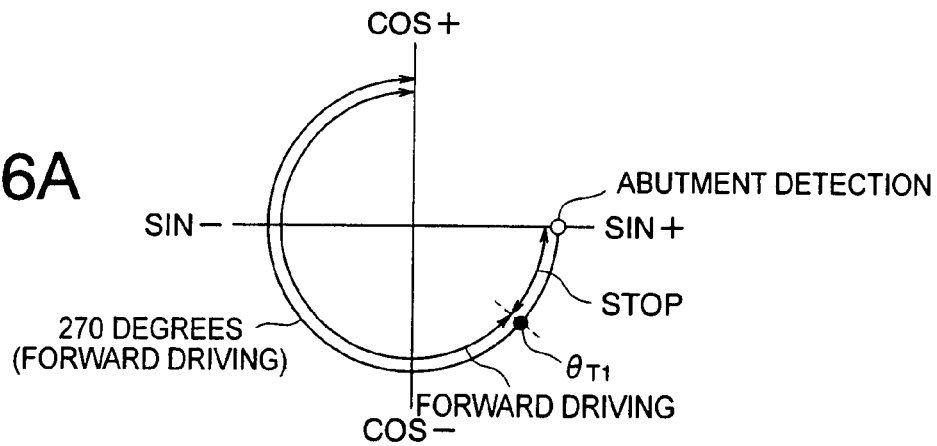
FIG. 6A is a drawing illustrating the operation principle of a stepper motor in accordance with an embodiment of the present invention.

In the case where the position where the protrusion 9 is in abutment with the stopper 10 is varied within the range of the phase COS− to the phase COS+ in the backward direction (i.e., when the forward or backward electrical angle with respect to the phase SIN+ at which the abutment has occurred at the time of being manufactured is within 180 degrees), an abutment is also detected at the phase SIN+, as shown in FIGS. 5 and 6A. In this case, CPU 12 drives the stepper motor 3 to rotate 270 degrees in the forward direction, transiting the phases of sine and cosine signals to the phase COS+.

For example, referring now to FIG. 6A, in the case where the protrusion 9 is in abutment with the stopper 10 at the phase $\theta_{T1}$, the abutment is detected at phase SIN+. In this case, during the initialization process, the phases of sine and cosine signals are varied within the range of the phase $\theta_{T1}$ to the phase SIN+, under the condition that rotation of the stepper motor 3 remains stationary. Accordingly, even if the stepper motor 3 is provided with sine and cosine signals configured to drive the stepper motor 3 to rotate 270 degrees in the forward direction from the phase COS+, in other words, even if the forward driving process is carried out, it is impossible to produce the rotational torque in a forward direction within the range of the phase SIN+ to the phase $\theta_{T1}$ in the stepper motor 3. In summary, the stepper motor 3 will remain stationary.

Thereafter, during the stepper motor 3, the rotational torque is produced in a forward direction within the range between phase $\theta_{T1}$ and the phase COS+. As is apparent from the above description, even if the stepper motor 3 is provided with sine and cosine signals configured to drive the stepper motor 3 to rotate 270 degrees in the forward direction, the stepper motor 3 can only rotate (270-Δθ) degrees in the forward direction, wherein Δθ degrees corresponds to the phase difference between the phase SIN+ and the phase $\theta_{T1}$.

Figure 6B:
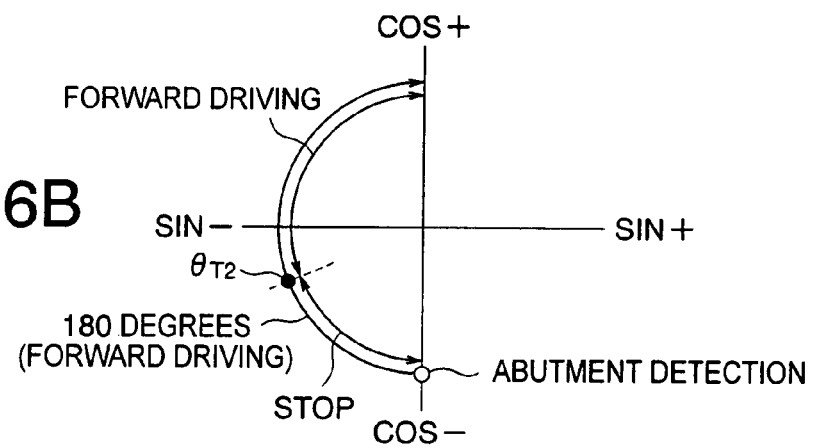
FIG. 6B is a drawing illustrating the operation principle of a stepper motor in accordance with another embodiment of the present invention.
Figure 6C:
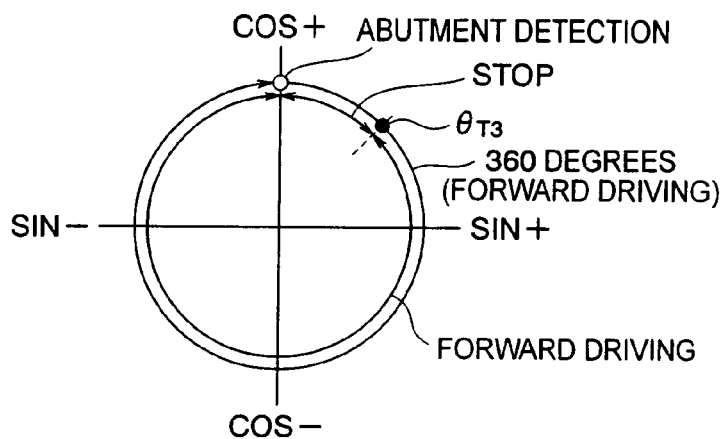
FIG. 6C is a drawing illustrating the operation principle of a stepper motor in accordance with yet another embodiment of the present invention.

Moreover, In the case where the position where the protrusion 9 is in abutment with the stopper 10 is varied within the range of the phase SIN+ to the phase COS+ in the backward direction (i.e. when the forward or backward electrical angle with respect to the phase SIN+ where the abutment has occurred at the point of being manufactured is from 0 to 180 degrees), an abutment is also detected at the phase COS− or COS+, as shown in FIGS. 5, 6B and 6C. Once the abutment is detected at the phase COS−, as shown in FIG. 6B, CPU 12 drives the stepper motor 3 to rotate 180 degrees in the forward direction, resulting in COS+ as the phases of sine and cosine signals.

In a similar manner, for example, referring to FIG. 6B, in the case where the protrusion 9 is in abutment with the stopper 10 at phase $\theta_{T2}$, the abutment is detected at phase COS−. In this case, during the initialization process, the phases of sine and cosine signals are varied within the range of the phase $\theta_{T2}$ to the phase COS−, under the condition that rotation of the stepper motor 3 remains stationary. Accordingly, even if the stepper motor 3 is provided with sine and cosine signals configured to drive the stepper motor 3 to rotate 180 degrees in the forward direction from the phase COS−, in other words, even if the forward driving process is carried out, it is impossible to produce the rotational torque in a forward direction within the range of the phase COS− to the phase $\theta_{T2}$ in the stepper motor 3. In summary, the stepper motor 3 will remain stationary.

Thereafter, during the stepper motor 3, the rotational torque is produced in a forward direction within the range of the phase $\theta_{T2}$ to the phase COS+. As is apparent from the above description, even if the stepper motor 3 is provided with sine and cosine signals configured to drive the stepper motor 3 to rotate 180 degrees in the forward direction, the stepper motor 3 can only rotate (180-Δθ) degrees in the forward direction, wherein Δθ degrees corresponds to the phase difference between the phase COS− and the phase $\theta_{T2}$.

On the other hand, once the abutment is detected at the phase COS+, as shown in FIG. 6C, CPU 12 drives the stepper motor 3 to rotate 360 degrees in the forward direction, resulting in COS+ as the phases of sine and cosine signals. In a similar manner, for example, referring to FIG. 6C, in the case where the protrusion 9 is in abutment with the stopper 10 at the phase $\theta_{T3}$, the abutment is detected at the phase COS+. In this case, during the initialization process, the phases of sine and cosine signals are varied within the range of the phase $\theta_{T3}$ to the phase COS+, under the condition that rotation of the stepper motor 3 remains stationary. Accordingly, even if the stepper motor 3 is provided with the sine and cosine signals configured to drive the stepper motor 3 to rotate 360 degrees in the forward direction, in other words, even if the forward driving process is carried out, it is impossible to produce the rotational torque in a forward direction within the range of the phase COS+ to the phase $\theta_{T3}$ in the stepper motor 3. In summary, the stepper motor 3 will remain stationary.

Thereafter, during the stepper motor, 3, the rotational torque is produced in the forward direction within the range between the phase $\theta_{T3}$ and the phase COS+. As is apparent from the above description, even if the stepper motor 3 is provided with sine and cosine signals configured to drive the stepper motor 3 to rotate 360 degrees in the forward direction, the stepper motor 3 can only rotate (360-Δθ) degrees in the forward direction, wherein Δθ degrees corresponds to the phase difference between the phase COS+ and the phase $\theta_{T3}$.

Accordingly, since the stepper motor 3 can begin to rotate at the same position (i.e., COS+), the phase of sine and cosine signals via the normal driving process, the pointer 1 can be prevented from rotating in relation with a change in the position where the protrusion 9 is in abutment with the stopper 10.

During the pointer 1 as described above, although either of the excitation coils 5 and 6 is controlled in a non-energized manner at the phase SIN−, the position detection process will not be carried out. Accordingly, this can guarantee that in the course of synchronization and acceleration, the abutment detection is not carried out by the position detection process. During synchronization and acceleration, the stepper motor 3 is driven with a low velocity, and a large amount of voltage will not induced at the both ends of the excitation coils 5 and 6. To prevent confusion between the above-discussed voltage value and the value measured in abutment detection, during synchronization and acceleration, the abutment detection is required not to be carried out by the position detection process.

While according to an embodiment of the present invention, no abutment detection is carried out at the phase SIN− even at the cycle after second cycle, the abutment detection may actually be carried out at the phase SIN− at any cycle after second cycle, for example, at third cycle.

In accordance with the above discussed embodiment of the present invention, during the initialization process, sine and cosine signals are provided in the backward direction from the phase COS+ which is 270 degrees out of phase with the phase SIN+ at which the abutment has occurred at the point of being manufactured. In this case, the abutting position is not altered, and, if only there is no loss of synchronism, immediately after synchronization and acceleration, the abutment detection can be carried out, allowing the stepper motor 3 to stop, which results in a decrease in moving angle of the pointer 1. However, when the electrical angle other than the afore-mentioned 270 degrees, for example, 180 degrees is needed to carry out synchronization and acceleration, the initialization process can be initiated at the phase which is 180 electrical degrees in the forward direction out of phase with the phase SIN+ where the abutment has occurred at the point of being manufactured.

In accordance with the above discussed embodiment of the present invention, in the case where the excitation coils 5 and 6 are provided with sine and cosine signals configured to drive the stepper motor 3 in the backward direction, the protrusion 9 is made to be in abutment with the stopper 10 when the phases of sine and cosine signals arrive at SIN+. However, a difficulty is encountered when all products cannot be manufactured such that the protrusion 9 is in abutment with the stopper 10 at the phase SIN+. This is, for example, because there are deviations in polarity of the magnetic rotor 7. Therefore, as the case may be, the protrusion 9 can be in abutment with the stopper 10 at the phase COS+ or SIN−. For the reason described above, white process is needed to be carried out prior to storing predetermined phases.

Specifically, when a switch for storage instruction (not shown) is switched on, CPU 12 begins to carry out the initialization process (i.e., the step S1) and the position detection process (i.e., the step S2). Subsequently, CPU 12a stores the phase, which is a predetermined phase difference (i.e., 270 degrees) out of phase with the phase of driving signal, as a predetermined phase in the memory such as EEPROM 23.

Although by storing the phase, which is 270 degrees out of phase with the position where the protrusion 9 is in abutment with the stopper 10 at the point of operating the "storage instruction" switch, as a predetermined phase, the abutting position has been changed in the forward direction with respect to the original abutting position (i.e., the abutting position when operating the "storage instruction" switch), the normal driving process can be initiated at the same position. For this reason, the pointer 1 can be securely prevented from movement resulting from a change in the position where the protrusion 9 is in abutment with the stopper 10.

Figure 7:
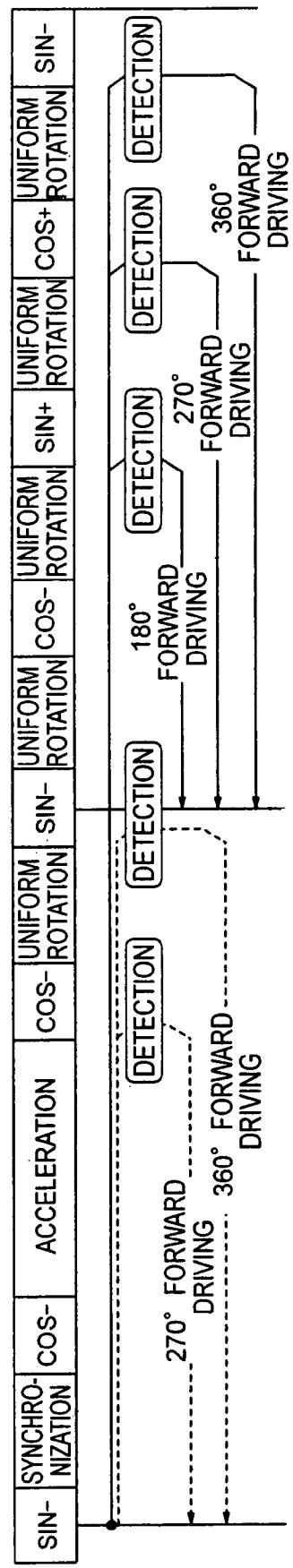
FIG. 7 is an exemplary timing chart illustrating timing for position detection, and phase variation in sine and cosine signals in the initialization process as depicted in FIG. 4.

While the initialization process in accordance with the afore-mentioned embodiment of the present invention begins at COS+, it must be understood that the present invention is not limited thereto. For example, according to another embodiment of the present invention, the process may begin at SIN−. Refer to FIG. 7 showing the timing chart which illustrates timing for position detection, and phase variation in sine and cosine signals in the initialization process of FIG. 4;

In other words, the sine and cosine signals begin to be provided at SIN− during the initialization process. While at the first cycle (i.e., Cycle 1), position detection must be carried out at the phases COS+ or SIN−, after Cycle 1, position detection can be carried out at the phases SIN+, COS+ or SIN−.

Figure 8:
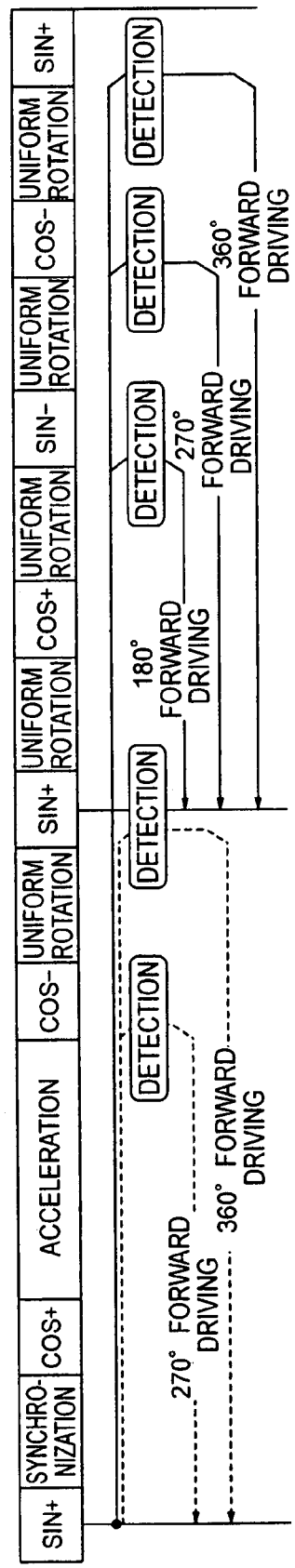
FIG. 8 is another exemplary timing chart illustrating timing for position detection, and phase variation in sine and cosine signals in the initialization process as depicted in FIG. 4.

Additionally, the initialization process may begin at SIN+. Refer to FIG. 8 showing the timing chart which illustrates timing for position detection, and phase variation in sine and cosine signals in the initialization process of FIG. 4. In other words, the sine and cosine signals begin to be provided at SIN+ during the initialization process. While at Cycle 1, position detection must be carried out at the phases COS− or SIN+, after Cycle 1, position detection can be carried out at the phases SIN−, COS− or SIN+.

Figure 9:
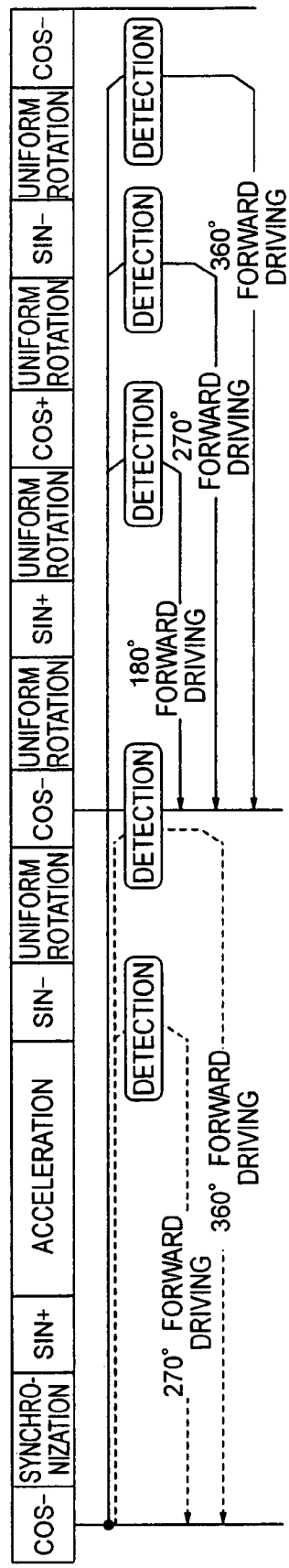
FIG. 9 is yet another exemplary timing chart illustrating timing for position detection, and phase variation in sine and cosine signals in the initialization process as depicted in FIG. 4.

Alternatively, the initialization may begin at COS−. Refer to FIG. 9 showing the timing chart which illustrates timing for position detection, and phase variation in sine and cosine signals in the initialization process of FIG. 4. In other words, the sine and cosine signals begin to be provided at COS− during the initialization process. While at Cycle 1, position detection must be carried out at the phases SIN− or COS−, after Cycle 1, position detection can be carried out at the phases COS+, SIN−or COS−.

While the excitation coils 5 and 6 are also utilized as detection coils for detecting whether induced voltage is produced or not in one preferred embodiment of the present invention, at least a coil which is other than the excitation coils 5 and 6 may be independently utilized as the detection coil. However, it is desirable to utilize the former (i.e., the excitation coils 5 and 6 used as the detection coils), because the latter may cause increased cost of the stepper motor apparatus by adding extra elements thereto.

While the predetermined phase difference is given as 270 degrees in one preferred embodiment of the present invention, it must be understood that the present invention is not limited thereto. The predetermined phase difference may be between 0 degree and 360 degrees, and is preferably 270 degrees.

In accordance with another preferred embodiment of the stepper motor apparatus and one preferred embodiment of the method for controlling the stepper motor, it is possible to begin to rotate the stepper motor at the predetermined phase (i.e., at the same position) by means of the normal driving device, even if a change in the position where the protrusion is in abutment with the stopper occurs depending on the aged deterioration or the thermal expansion of each components comprising the stepper motor apparatus due to, for example, a change in ambient temperature.

In accordance with yet another embodiment of the stepper motor apparatus, as long as the position where the driven member is in abutment with the stopper is altered from 0 to 180 degrees in the forward or backward direction with respect to the abutting position when the storage instruction has been output, the driving operation can be initiated by the normal driving device at the same position.

The foregoing discussion discloses and describes an exemplary embodiment of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. A stepper motor apparatus, including:
    a stepper motor rotating in response to a driving signal, a duty cycle of which is modulated, supplied thereto in order to drive a pointer;
    a stopper configured to stop rotation of the stepper motor mechanically in cases where a driven member associated with the stepper motor is in abutment therewith;
    an initialization driving device configured to feed the driving signal into the stepper motor in order to drive the stepper motor to rotate in a backward direction where the driven member is driven toward the stopper;
    a detection coil producing an induced voltage by means of rotation of the stepper motor;
    a position detection device configured to determine whether the driven member is in abutment with the stopper or not by examining the induced voltage on the detection coil;
    a first stopping device configured to stop rotation of the stepper motor in the backward direction by maintaining driving signal's phase at which the abutment is detected by the position detection device; and
    a normal driving device configured to feed the driving signal into the stepper motor in order to drive the stepper motor to rotate in a direction where the pointer homes in on its commanded position, after first stop by the first stopping device, characterized by further including:
- a memory configured to store a predetermined phase;
- a forward driving device configured to feed the driving signal into the stepper motor in order to drive the stepper motor to rotate in a forward direction where the driven member is driven against the stopper, after first stop by the first stopping device; and
- a second stopping device configured to stop rotation of the stepper motor in the forward direction by maintaining the predetermined phase when the driving signal transmitted by the forward driving device arrives at the predetermined phase, wherein the normal driving device drives the stepper motor to rotate again after second stop by the second stopping device.

2. The stepper motor apparatus according to claim 1, further including:
- a drive initiating device configured to initiate operations of both the initialization driving device and the position detection device, pursuant to a storage instruction, and
- a storing device configured to store a phase, which is a predetermined phase difference out of phase with the driving signal's phase at which the abutment is detected by the position detection device, as the predetermined phase in the memory.

3. The stepper motor apparatus according to claim 2, wherein the predetermined phase difference is 270 degrees.

4. A method for controlling a stepper motor, comprising the steps of:
- (A) feeding a driving signal, a duty cycle of which is modulated, into the stepper motor in order to drive the stepper motor to rotate in a backward direction where a driven member associated with the stepper motor is driven toward a stopper;
- (B) determining whether the driven member is in abutment with the driven member or not by examining an induced voltage on a detection coil resulting from the step (A);
- (C) stopping rotation of the stepper motor in the backward direction by maintaining the driving signal's phase at which the abutment is detected in step (B); and
- (D) feeding the driving signal into the stepper motor in order to drive the stepper motor to rotate in a direction where a pointer, which is driven by the stepper motor, homes in on its commanded position after the step (C), in stepwise fashion, characterized by further including following steps between the step (C) and the step (D):

feeding the driving signal into the stepper motor in order to drive the stepper motor to rotate in a direction where the driven member is driven against the stopper, and subsequently stopping rotation of the stepper motor in the forward direction by maintaining a predetermined phase when the driving signal arrives at the predetermined phase stored in a memory.

5. A method for controlling a stepper motor, comprising the steps of:
- (A) feeding a driving signal, a duty cycle of which is modulated, into the stepper motor in order to drive the stepper motor to rotate in a backward direction where a driven member associated with the stepper motor is driven toward a stopper;
- (B) determining whether the driven member is in abutment with the driven member or not by examining an induced voltage on a detection coil resulting from the step (A);
- (C) stopping rotation of the stepper motor in the backward direction by maintaining the driving signal's phase at which the abutment is detected in step (B); and
- (D) feeding the driving signal into the stepper motor in order to drive the stepper motor to rotate in a forward direction where a pointer, which is driven by the stepper motor, homes in on its commanded position after the step (C), in stepwise fashion, characterized by further including following steps between the step (C) and the step (D):

feeding the driving signal into the stepper motor in order to drive the stepper motor to rotate an amount of phase difference between the phase as maintained in the step (C) and a predetermined phase stored in a memory, in a forward direction where the driven member is driven against the stopper, and subsequently stopping rotation of the stepper motor in the forward direction by maintaining the predetermined phase, after completion of the afore-mentioned driving signal supply.

* * * * *